(12) United States Patent
Hsu

(10) Patent No.: US 9,678,109 B2
(45) Date of Patent: Jun. 13, 2017

(54) PROBE CARD

(71) Applicant: Taiwan Semiconductor Manufacturing CO., LTD., Hsinchu (TW)

(72) Inventor: Ming-Cheng Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 79 days.

(21) Appl. No.: 14/151,052

(22) Filed: Jan. 9, 2014

(65) Prior Publication Data

US 2015/0192608 A1    Jul. 9, 2015

(51) Int. Cl.
*G01R 1/067* (2006.01)
*G01R 1/073* (2006.01)

(52) U.S. Cl.
CPC ..... *G01R 1/07314* (2013.01); *G01R 1/07371* (2013.01)

(58) Field of Classification Search
CPC ........ G01R 31/28; G01R 31/30; G01R 1/073; G01R 1/06738; G01R 1/06711; G01R 1/06794; G01R 1/07314; G01R 1/067; G01R 1/0675; H01L 2224/73204; H01L 2224/13076
USPC .............. 324/750–756, 762, 754.07, 755.01, 324/754.03, 756.03; 29/829, 428, 825, 29/840, 852, 831–832
See application file for complete search history.

(56) References Cited

U.S. PATENT DOCUMENTS

| | | | | |
|---|---|---|---|---|
| 4,374,369 A * | 2/1983 | Sakamoto | ............. | H04B 15/02 333/182 |
| 4,731,577 A * | 3/1988 | Logan | ................ | G01R 1/07342 324/750.29 |
| 6,351,011 B1 * | 2/2002 | Whitney | ................ | H01L 23/62 257/355 |
| 7,323,712 B2 * | 1/2008 | Kokubo et al. | ................ | 257/48 |
| 7,616,018 B2 * | 11/2009 | Lou et al. | ................ | 324/750.04 |
| 7,898,272 B2 * | 3/2011 | Sasaki et al. | ............ | 324/756.03 |
| 2003/0141889 A1 * | 7/2003 | Chen et al. | ..................... | 324/765 |
| 2006/0145717 A1 * | 7/2006 | Yun | ..................... | G01R 31/2886 324/754.03 |
| 2006/0170438 A1 * | 8/2006 | Park | .................... | G01R 1/07342 324/754.07 |
| 2007/0013390 A1 * | 1/2007 | Kuitani et al. | ................. | 324/754 |
| 2009/0224780 A1 * | 9/2009 | Chao et al. | .................... | 324/754 |
| 2009/0293274 A1 * | 12/2009 | Kister | ............................ | 29/879 |
| 2010/0164520 A1 * | 7/2010 | Kiyofuji et al. | ............... | 324/754 |
| 2010/0207260 A1 * | 8/2010 | Chen | ........................ | H01L 24/49 257/670 |
| 2012/0153446 A1 * | 6/2012 | Jiang | ..................... | H01L 21/565 257/673 |
| 2012/0235697 A1 * | 9/2012 | Jang | ................... | G01R 31/2886 324/754.03 |

(Continued)

*Primary Examiner* — Arleen M Vazquez
*Assistant Examiner* — Neel Shah

(57) ABSTRACT

An apparatus and a method are disclosed herein. The apparatus is disclosed that includes a probe head and a circuit board. The probe head includes a metal housing and pins. The pins penetrate through the metal housing. The circuit board is configured to test a semiconductor device and includes a ground pad. The ground pad is electrically coupled between the metal housing and the circuit board.

17 Claims, 8 Drawing Sheets

(56) References Cited

U.S. PATENT DOCUMENTS

| | | | |
|---|---|---|---|
| 2012/0313659 A1* | 12/2012 | Hsu | G01R 1/07314 324/755.05 |
| 2012/0319711 A1* | 12/2012 | Hung | G01R 1/07371 324/750.16 |
| 2014/0015560 A1* | 1/2014 | Campardo | G01R 1/07378 324/756.03 |
| 2014/0167799 A1* | 6/2014 | Wang | H02H 9/046 324/750.14 |

* cited by examiner

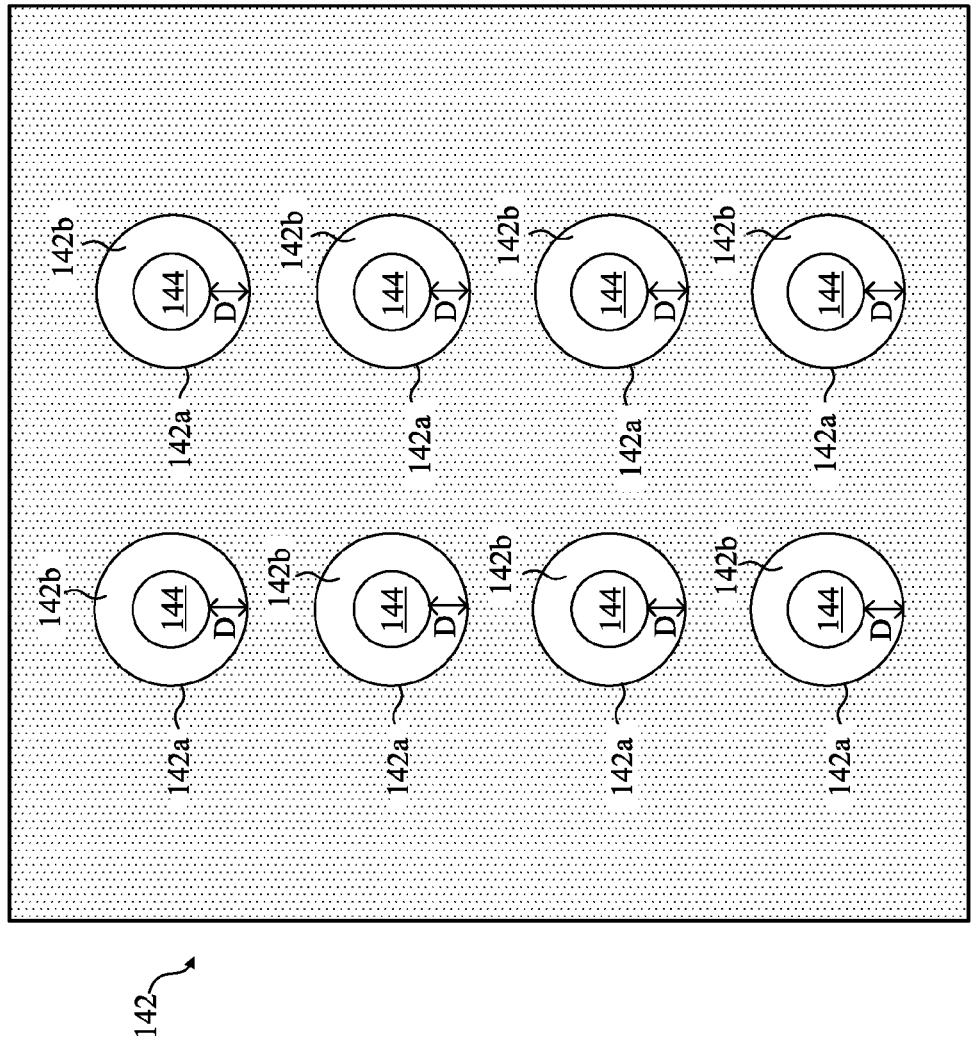

PROBE CARD

BACKGROUND

Testing is a key operation of semiconductor fabrication. To facilitate testing on numerous semiconductor devices (e.g., chips or dies) on a wafer at the same time, probe cards are used. A probe card includes probes that correspond to contact pads on the wafer for the semiconductor devices.

Each of the semiconductor devices has contact pads accessed for testing. To allow for more contact pads connected to the semiconductor devices, wafer level chip scale package (WLCSP) was developed. In the WLCSP technology, the semiconductor device is packaged on the wafer level. By using the WLCSPs and the probe cards, the semiconductor devices are tested more effectively with an automated test equipment (ATE).

BRIEF DESCRIPTION OF THE DRAWINGS

The disclosure can be more fully understood by reading the following detailed description of the embodiment, with reference made to the accompanying drawings as follows:

FIG. 1B is a bottom view of the metal housing in FIG. 1A in accordance with various embodiments of the present disclosure;

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1A:
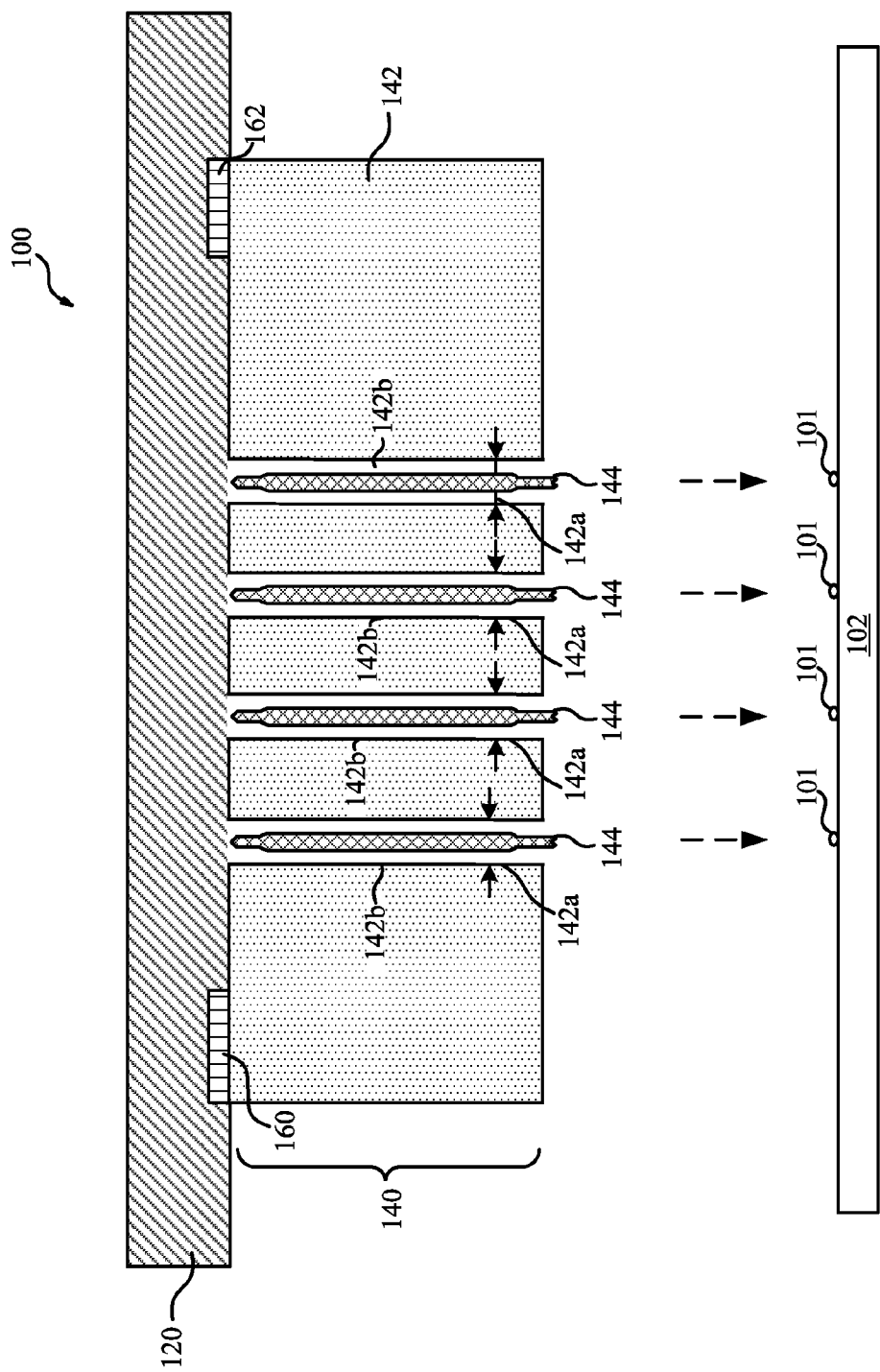
FIG. 1A is a cross-sectional view of a probe card in accordance with various embodiments of the present disclosure.

FIG. 1A is a cross-sectional view of a probe card 100 in accordance with various embodiments of the present disclosure. As shown in FIG. 1A, the probe card 100 is configured to test functionality of devices-under-test (DUTs). In some embodiments, the DUTs include semiconductor chips or dies with contact pads. For illustration in FIG. 1A, the semiconductor chips or dies are implemented with solder ball or wafer level chip scale package (WLCSP) balls 101 on a wafer 102.

The probe card 100 includes a circuit board 120 and a probe head 140. The circuit board 120 is attached onto the probe head 140. In some embodiments, the circuit board 120 is a printed circuit board (PCB) having certain testing circuits. In some other embodiments, the probe card 100 connects the DUTs to the ATE (not shown) for testing.

The probe head 140 is configured to be connected with the DUTs. The probe head 140 includes a metal housing 142 and pins 144 which, in some embodiments, are pogo pins. In some embodiments, the metal housing 142 is formed by metals having an electric conductivity which is sufficient to allow noise signals to be conducted. In further embodiments, the metal housing 142 is formed by copper (Cu).

Further, as shown in FIG. 1A, the circuit board 120 includes a ground pad 160 and a ground pad 162. The ground pad 160 is disposed at a left side of a top surface facing the circuit board 120 of the metal housing 142. The ground pad 162 is disposed at a right side of the top surface of the metal housing 142. The ground pads 160 and 162 electrically connect the circuit board 120 to the metal housing 142. The ground pads 160 and 162 of the circuit board 120 are electrically connected to ground.

Figure 2:
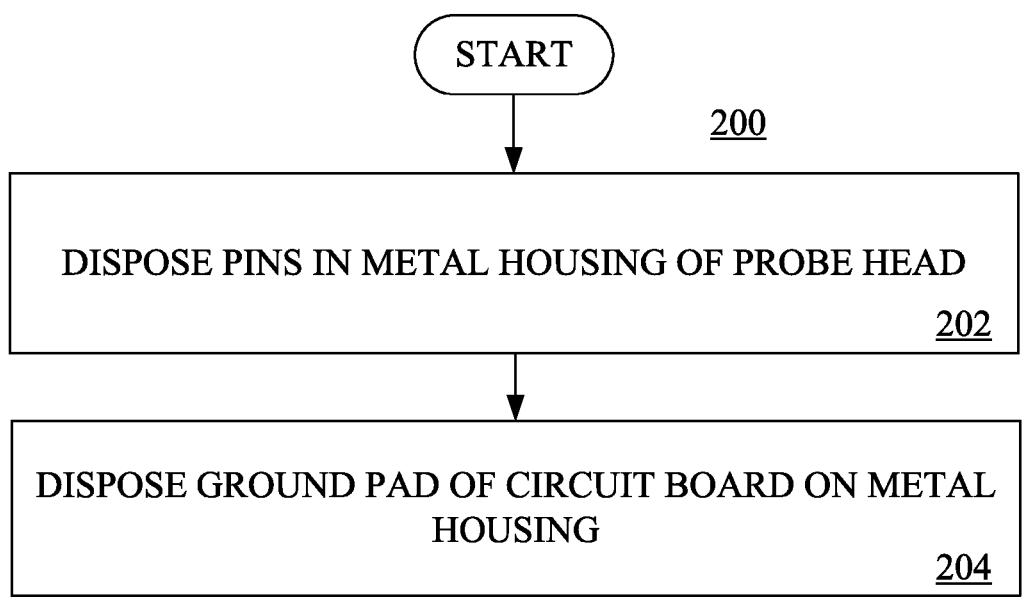
FIG. 2 is a flow chart of a manufacturing method of the probe card in FIG. 1A, in accordance with various embodiments of the present disclosure.

FIG. 1B is a bottom view of the metal housing 142 shown in FIG. 1A in accordance with various embodiments of the present disclosure. FIG. 2 is a flow chart of a manufacturing method 200 of the probe card 100 in FIG. 1A, in accordance with various embodiments of the present disclosure. For illustration, the operations of the method 200 in FIG. 1 are described with reference to FIG. 1A and FIG. 1B.

In operation 202, the pins 144 are disposed in the metal housing 142. For illustration, as shown in FIG. 1A and FIG.

1B, the metal housing 142 is drilled to form through-holes 142a. The pins 144 are located in the through-holes 142a and are aligned in parallel.

Accordingly, each of the pins 144 penetrates through one through-hole 142a and is physically connected to a corresponding WLCSP ball 101 and the circuit board 120. Effectively, the pins 144 provide signal traces for the circuit board 120 to test the DUTs.

Numbers of the ground pads, the through-holes 142a and the pins 144 in FIG. 1A and FIG. 1B are given for illustrative purposes. Various numbers and configurations of the ground pads, the through-holes 142a and the pins 144 are within the contemplated scope of the present disclosure.

In operation 204, the ground pads 160 and 162 of the circuit board 120 are disposed on the metal housing 142. In some embodiments, the ground pads 160 and 162 are printed on the circuit board 120.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 3A:
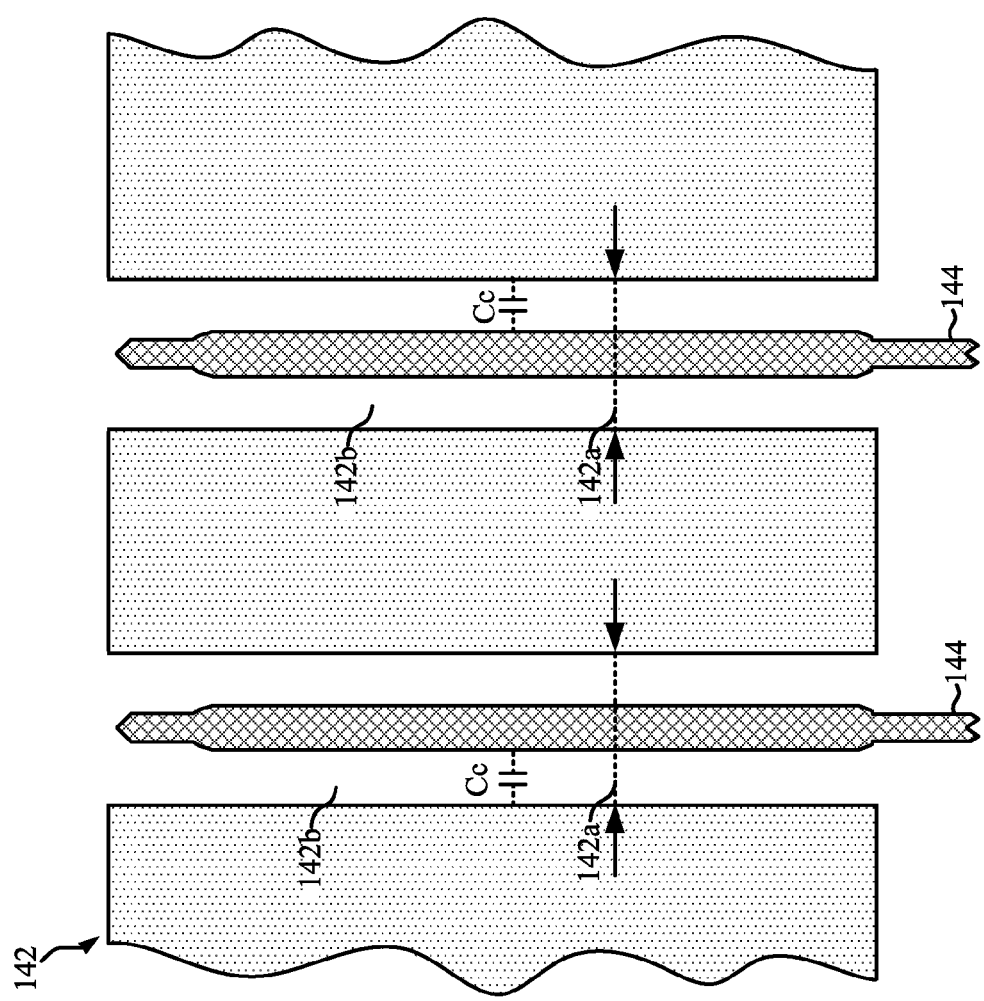
FIG. 3A is a fragmentary enlarged view illustrating a portion of the metal housing and the pins in FIG. 1A, in accordance with various embodiments of the present disclosure.

FIG. 3A is a fragmentary enlarged view illustrating a portion of the metal housing 140 and the pins 144 in FIG. 1A, in accordance with various embodiments of the present disclosure.

During testing procedure, test signals (not shown) are transmitted from the circuit board 120 to the DUTs through the pins 144. An undesired effect, such as crosstalk, is accordingly caused by undesired certain conductive couplings from one pin 144 to another.

For illustration, as shown in FIG. 3A, a coupling capacitor Cc between the metal housing 142 and the pins 144 is generated by the signal transmission. The coupling capacitor Cc causes the crosstalk that prevents the DUTs from receiving the test signals correctly.

Figure 3B:
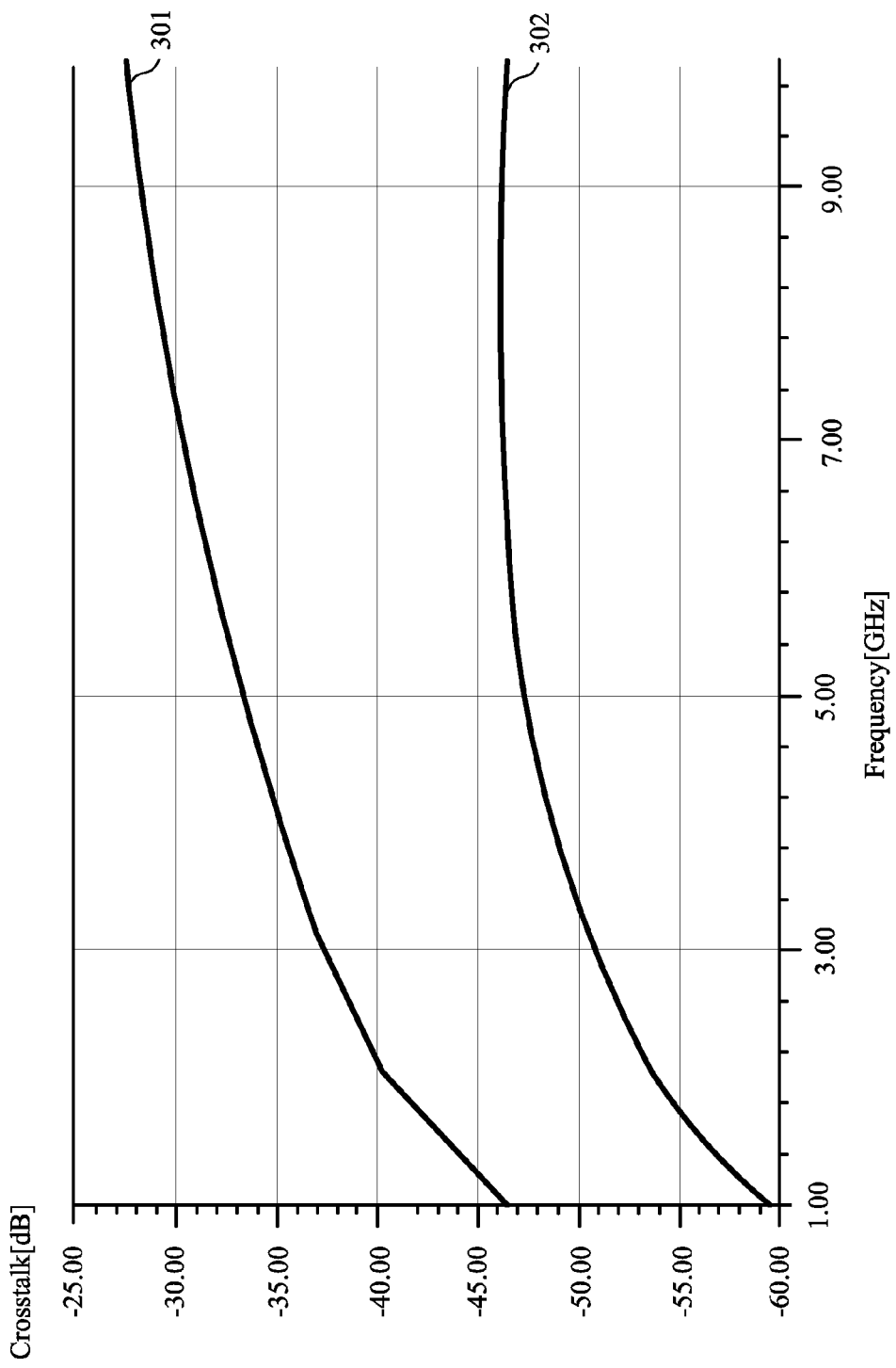
FIG. 3B is a graph illustrating a crosstalk performance comparison of the probe head in FIG. 1A and a probe card used in some approaches, in accordance with various embodiments of the present disclosure.

FIG. 3B is a graph illustrating a crosstalk performance comparison of the probe card 100 in FIG. 1A with a probe card used in some approaches, in accordance with various embodiments of the present disclosure.

As mention above, the ground pads 160 and 162 of the circuit board 120 are electrically connected between the circuit board 120 and metal housing 142. That is, the ground pads 160 and 162 provide a grounding path for the metal housing 142. Therefore, the metal housing 142 provides a ground shielding protection for the pins 144.

By ground shielding which employs the ground pads 160 and the 162, noises or interferences generated by the crosstalk are bypassed to ground. As shown in FIG. 3B, a curve 301 indicates the crosstalk performance of the probe head used in some approaches without ground shielding. Moreover, a curve 302 indicates the crosstalk performance of the probe card 100. With a test signal having substantially 7 gigahertz (GHz) frequency, the crosstalk of the probe card used in some approaches is substantially −31 decibel (dB), and the crosstalk of the probe card 100 is substantially −46 dB. As a result, the crosstalk the probe card 100 is improved.

In addition, for impedance matching, dielectric materials are filled into the through-holes 142a to electrically insulate the pins 144 from the metal housing 142. In some embodiments, the dielectric materials include air. For illustration, as shown in FIG. 1B, the metal housing 142 includes air gaps 142b. Each of the air gaps 142b encircles a corresponding pin 144. The air gap 142b is defined by a distance D between the pin 144 and edges of the through-hole 142a. The distance D is utilized to adjust the impedance of pins 144. In some embodiments, the distance D is selected so that the impedance of pins 144 is substantially 50 ohms. In other some embodiments, the impedance of pins 144 is set to substantially 75 ohms.

Figure 4A:
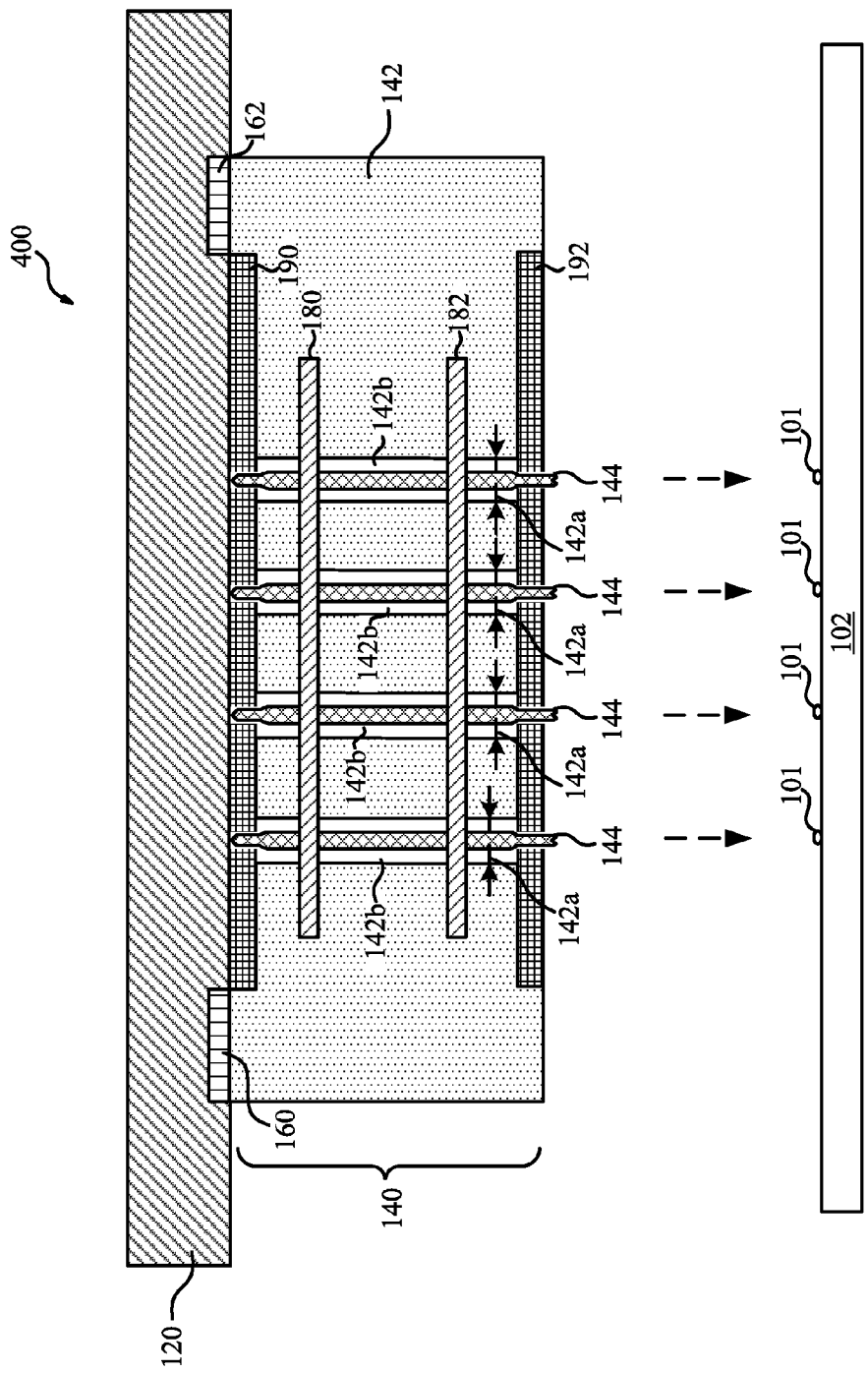
FIG. 4A is a cross-sectional view of a probe card in accordance with various embodiments of the present disclosure.

FIG. 4A is a cross-sectional view of a probe card 400 in accordance with various embodiments of the present disclosure. In practical, the impedance of the pins 144 may vary when the pins 144 shift away from parallel alignment. Compared with the probe card 100 in FIG. 1A, as shown in FIG. 4A, the metal housing 142 of the probe card 400 further includes a membrane 180 and a membrane 182. In some embodiments, the membranes 180 and 182 are made of electric isolating material. In further embodiments, the electric isolating material includes Mylar.

The membrane 180 is mounted at upper portions of the pins 144, and is close to the circuit board 120. The membrane 182 is mounted at lower portions of the pins 144, and is opposite to the membrane 180. The membranes 180 and 182 are configured to support the pin 144 for maintaining the parallel alignment. In other words, the membranes 180 and 182 are utilized to prevent the pins 144 from shifting away. As a result, the distance D and the impedance of the pins 144 are able to be hold in a steady state.

In some embodiments, the probe head 140 is integrally molded. In some other embodiments, the probe head 140 is implemented with assembly parts. In further embodiments, the metal housing 142 is formed of multi-layer metal. The membranes 180 and the 182 are secured in the multi-layer metal. For illustration, the membranes 180 and 182 are sandwiched between any two layers of the multi-layer metal. Thus, to assembly the entire structure of the probe head 140, the membranes 180 and 182 and the metal housing 142 are secured by fixed parts. In some embodiments, the fixed parts include screws.

The arrangement and the quantities shown of the membranes in FIG. 4A are given for illustrative purposes. Other arrangements and quantities are within the contemplated scope of the present disclosure.

Figure 4B:
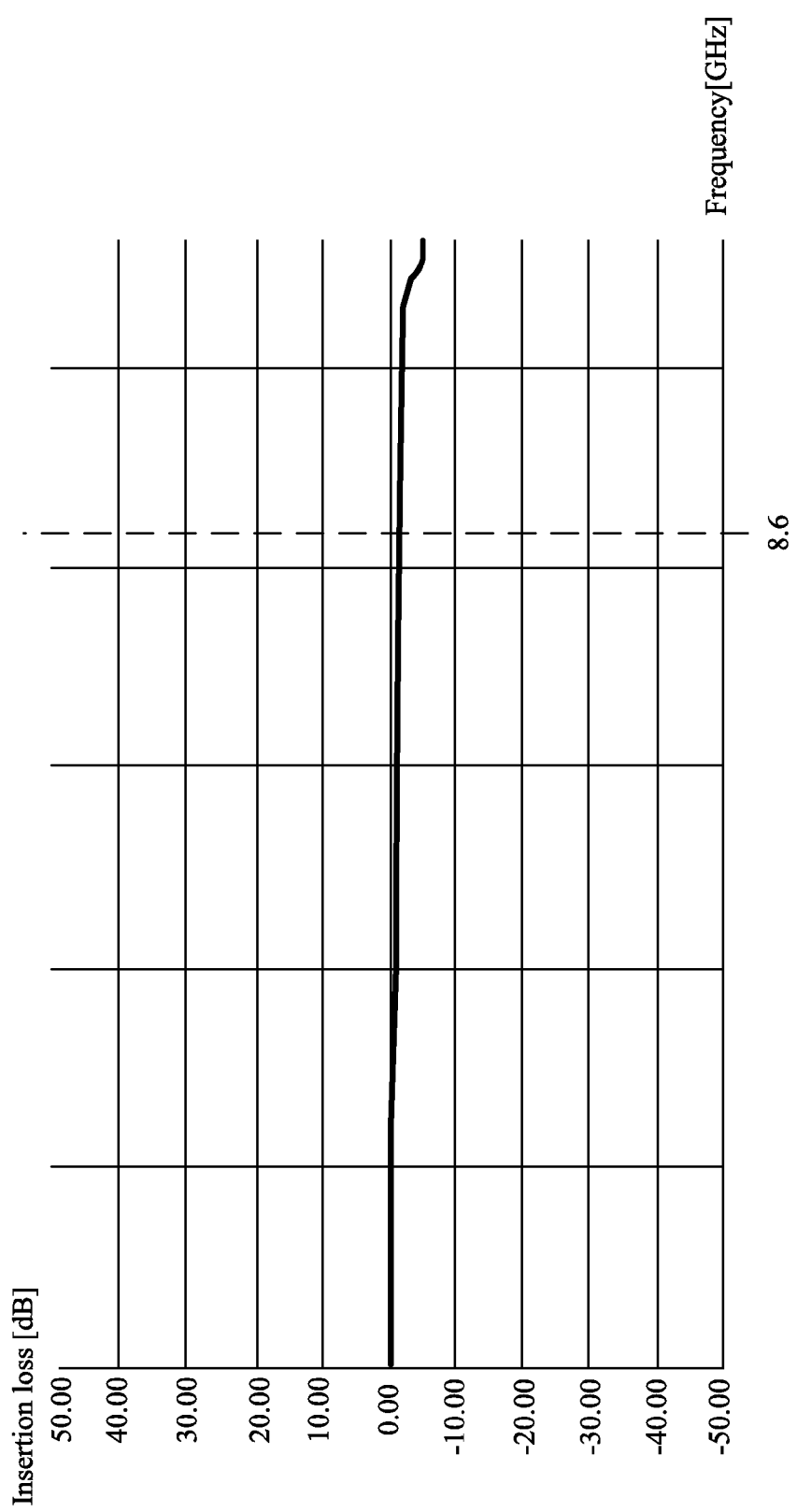
FIG. 4B is a graph illustrating an insertion loss of a probe card used in some approaches.
Figure 4C:
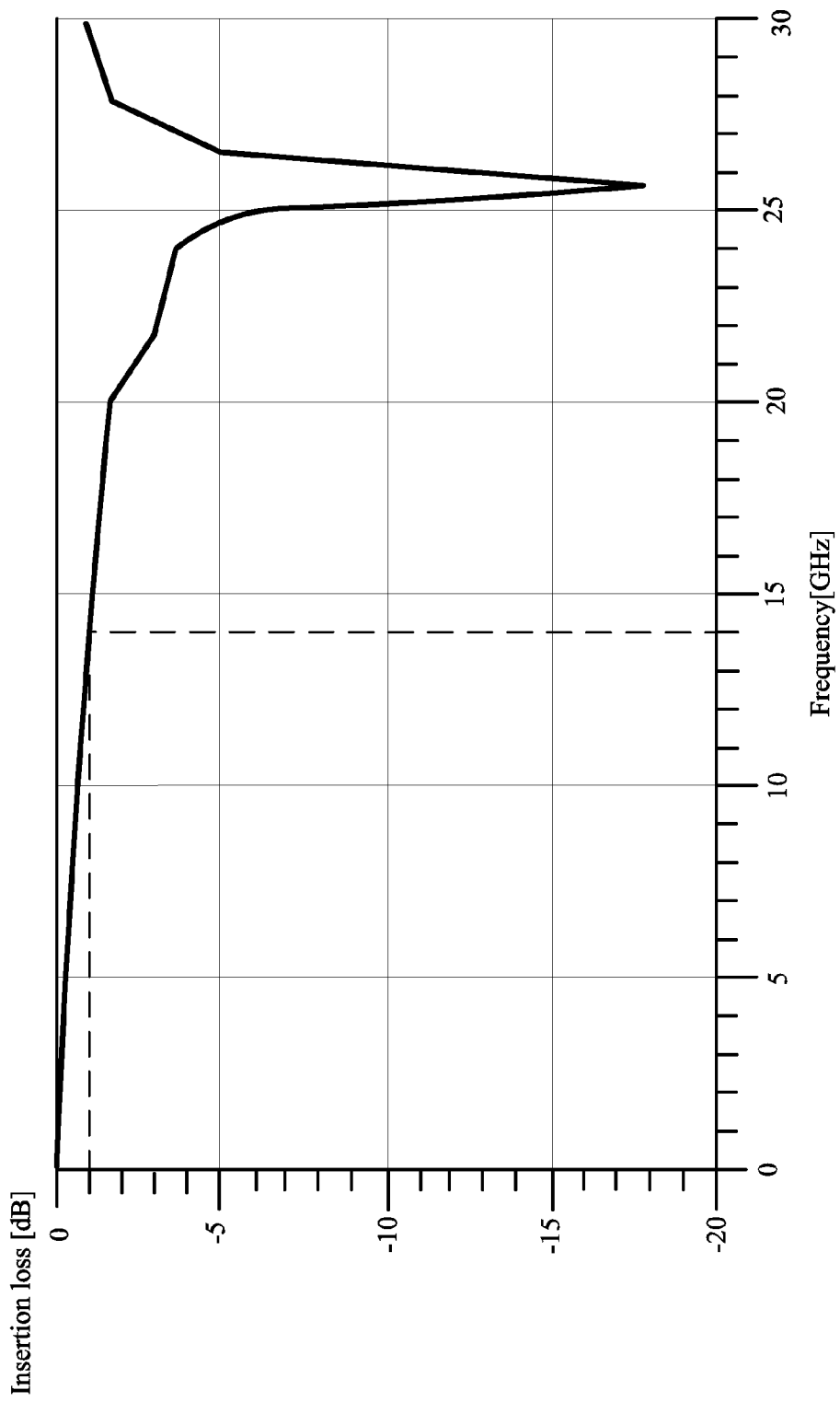
FIG. 4C is a graph illustrating an insertion loss of the probe card in FIG. 1A in accordance with various embodiments of the present disclosure.

FIG. 4B is a graph illustrating an insertion loss of a probe card used in some approaches. FIG. 4C is a graph illustrating an insertion loss of the probe card 400 in FIG. 4A in accordance with various embodiments of the present disclosure.

As shown in FIG. 4B, the bandwidth of the probe head used in some approaches is substantially 8.6 GHz. By controlling impedance of the pins 144 with the steady alignment, the bandwidth of the probe card 400 is increased up to substantially 14 GHz. Therefore, the probe card 400 is suitable for testing the DUTs operating with a radio frequency.

In addition, during the testing procedure, the pins 144 extend out of the top surface and the bottom surface of the metal housing 142 to be connected to the circuit board 120 and the DUTs, respectively.

In some embodiments, for providing a further improved alignment for the extending portions of the pins 144, as shown in FIG. 4A, the probe card 400 further includes an upper die 190 and a lower die 192. The upper die 190 is disposed between the circuit board 120 and the metal housing 142, and the lower die 192 is disposed between the metal housing 142 and the DUTs. The upper die 190 and the lower die 192 are utilized to prevent the extending portions of the pins 144 from misalignment. Further, the upper die 190 and the lower die 192 are made of electric isolating material to prevent the pins 144 from being short-circuited to each other. In some embodiments, the upper die 190 and the lower die 192 are made of engineering plastics, but are not limited thereto.

In some embodiments, an apparatus is disclosed that includes a probe head and a circuit board. The probe head includes a metal housing and pins. The pins penetrate through the metal housing. The circuit board is configured to test a semiconductor device and includes a ground pad. The ground pad is electrically coupled between the metal housing and the circuit board.

Also disclosed is an apparatus that includes a circuit board, a metal housing, membranes and pins. The metal housing is attached to the circuit broad and the metal housing includes through-holes. The pins are disposed in the through-holes, and the circuit board contacts with a device-under-test (DUT) by the pins. The membranes are attached to the metal housing, and the membranes include a first membrane and a second membrane. The first membrane is mounted at upper portions of the pins, and the second membrane is mounted to lower portions of the pins.

Also disclosed is a method for testing a semiconductor device by using a probe card, and the method includes operations below. Pins are disposed in a metal housing of a probe head. At least one ground pad of a circuit board is disposed on the metal housing. The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. An apparatus, comprising:
   a probe head, comprising:
      a metal housing;
         a plurality of pins penetrating through the metal housing; and
   a circuit board configured to test a semiconductor device, wherein the pins contact the circuit board, and are configured to couple the semiconductor device to the circuit board, and the circuit board comprises a ground pad,
   wherein the ground pad of the circuit board is in direct contact with the metal housing, to couple the metal housing to ground; and
   a plurality of membranes mounted inside of the metal housing to support the pins,
   wherein the metal housing comprises a multi-layer metal, and each of the membranes is sandwiched between two layers of the multi-layer metal.

2. The apparatus of claim 1,
   wherein the membranes are configured to keep a predetermined distance of an air gap surrounding each of the pins.

3. The apparatus of claim 2, wherein an impedance of each of the pins is determined by the predetermined distance.

4. The apparatus of claim 1, wherein the membranes comprise:
   a first membrane mounted at upper portions of the pins; and
   a second membrane mounted at lower portions of the pins.

5. The apparatus of claim 1, wherein the membranes are made of electric isolating material.

6. The apparatus of claim 1, wherein the pins are aligned in parallel, the apparatus further comprising:
   an upper die disposed on a top surface of the metal housing, wherein the top surface of the metal housing faces to the circuit board; and
   an lower die disposed on a bottom surface of the metal housing, wherein the upper die and the lower die are configured to electrically isolate the pins from each other and to keep the pins being in parallel alignment.

7. An apparatus, comprising:
   a circuit board comprising a first ground pad coupled to ground;
   a metal housing attached to the circuit board and directly contacting with and coupled to the first ground pad of the circuit board, the metal housing comprising a plurality of through-holes;
   a plurality of pins disposed in the through-holes, wherein the pins contact the circuit board, and are configured to couple the circuit board to a device-under-test (DUT); and
   a plurality of membranes mounted inside of the metal housing, the membranes comprising:
      a first membrane mounted at upper portions of the pins; and
      a second membrane mounted at lower portions of the pins,
   wherein the metal housing comprises a multi-layer metal, and each of the first membrane and the second membrane is sandwiched between two layers of the multi-layer metal.

8. The apparatus of claim 7, wherein the first ground pad is disposed at a first side of a top surface of the metal housing, the top surface of the metal housing faces to the circuit board, and the circuit board further comprises:
   a second ground pad coupled to ground and disposed at a second side of the top surface of the metal housing.

9. The apparatus of claim 8, wherein the second ground pad directly contacts with the metal housing.

10. The apparatus of claim 7, wherein the metal housing comprises a plurality of air gaps surrounding the pins, and the air gaps are defined by a predetermined distance between edges of the through-holes and the pins.

11. The apparatus of claim 10, wherein an impedance of each of the pins is determined by the predetermined distance.

12. The apparatus of claim 7, further comprising:
   an upper die disposed on a top surface of the metal housing, wherein the top surface of the metal housing faces to the circuit board; and
   an lower die disposed on a bottom surface of the metal housing.

13. A method comprising:
   disposing a plurality of pins penetrating through a metal housing of a probe head;
   disposing at least one ground pad of a circuit board in direct contact with the metal housing, wherein the metal housing is coupled to ground via the at least one ground pad of a circuit board, the pins contact the circuit board, and are configured to couple the circuit board to a device-under-test; and
   disposing a plurality of membranes inside of the metal housing to support the pins, wherein the metal housing is made of a multi-layer metal, disposing the membranes comprising:

disposing each of the membranes between two layers of the multi-layer metal.

14. The method of claim 13, wherein disposing the at least one ground pad comprises:

disposing a first ground pad at a first side of a top surface of the metal housing, wherein the top surface of the metal housing faces to the circuit board and disposing a second ground pad at a second side of the top surface of the metal housing.

15. The method of claim 13, wherein the membranes aligns the pins in parallel.

16. The method of claim 13, wherein disposing the membranes comprising:

mounting a first membrane of the membranes at upper portions of the pins, and mounting a second membrane of the membranes at lower portions of the pins.

17. The method of claim 13, further comprising:

disposing an upper die on a top surface of the metal housing, wherein the top surface of the metal housing faces to the circuit board; and disposing an lower die on a bottom surface of the metal housing.

\* \* \* \* \*